United States Patent
Berggren et al.

(10) Patent No.: US 6,429,457 B1
(45) Date of Patent: Aug. 6, 2002

(54) FIELD-EFFECT TRANSISTOR

(75) Inventors: Rolf Magnus Berggren; Bengt Goran Gustafsson; Johan Roger Axel Karlsson, all of Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/380,611

(22) PCT Filed: Jan. 14, 1999

(86) PCT No.: PCT/NO99/00013

§ 371 (c)(1),
(2), (4) Date: Sep. 15, 1999

(87) PCT Pub. No.: WO99/40631

PCT Pub. Date: Aug. 12, 1999

(30) Foreign Application Priority Data

Jan. 16, 1998 (NO) ................................. 980224
Nov. 23, 1998 (NO) ................................. 985472

(51) Int. Cl.⁷ ........................ H01L 21/84; H01L 29/786
(52) U.S. Cl. ........................ 257/60; 257/328; 257/347; 438/156
(58) Field of Search ........................ 257/328, 347, 257/60; 438/156

(56) References Cited

U.S. PATENT DOCUMENTS

| 4,587,540 A | | 5/1986 | Jackson |
| 4,677,451 A | | 6/1987 | Parsons et al. |
| 4,735,918 A | | 4/1988 | Parsons et al. |
| 4,903,089 A | * | 2/1990 | Hollis et al. ................. 357/22 |
| 4,924,279 A | * | 5/1990 | Shimbo ...................... 257/60 |
| 5,047,812 A | | 9/1991 | Pfiester |
| 5,206,531 A | * | 4/1993 | Dandekar .................... 257/270 |
| 5,563,077 A | | 10/1996 | Ha |
| 5,780,911 A | | 7/1998 | Park et al. |
| 5,990,509 A | * | 11/1999 | Burns, Jr. et al. ............ 257/296 |
| 6,165,823 A | * | 12/2000 | Kim ........................... 257/60 |

* cited by examiner

Primary Examiner—Jerome Jackson, Jr.
(74) Attorney, Agent, or Firm—Jacobson Holman, PLLC

(57) ABSTRACT

A field-effect transistor is made with electrodes (2, 4, 5) and isolators (3) in vertically provided layers, such that at least the electrodes (4, 5) and the isolators (3) form a step (6) oriented vertically relative to the first electrode (2) or the substrate (1). Implemented as a junction field-effect transistor (JFET) or a metal-oxide semiconducting field-effect transistor (MOSFET) the electrodes (2, 5) forming respectively the drain and source electrode of the field-effect transistor or vice versa and the electrode (4) the gate electrode of the field-effect transistor. Over the layers in the vertical step (6) an amorphous, polycrystalline or microcrystalline inorganic or organic semiconductor material is provided and forms the active semiconductor of the transistor contacting the gate electrode (8) directly or indirectly and forming a vertically oriented transistor channel (9) of the p or n type between the first (2) and the second (5) electrode. In a method for fabrication of a field effect transistor a vertical step (6) is formed by a means of a photolithographic process and a soluble amorphous active semiconductor material (8) is deposited over the first electrode (2) and the vertical step (6) such that a vertically oriented transistor channel between the drain and source electrode (2, 5) is obtained. In a JFET the semiconductor material (8) contacts the gate electrode (4) directly. In a MOSFET a vertically oriented gate isolator (7) is provided between the gate electrode (4) and the semiconductor material (8).

14 Claims, 5 Drawing Sheets

Figure 1C:
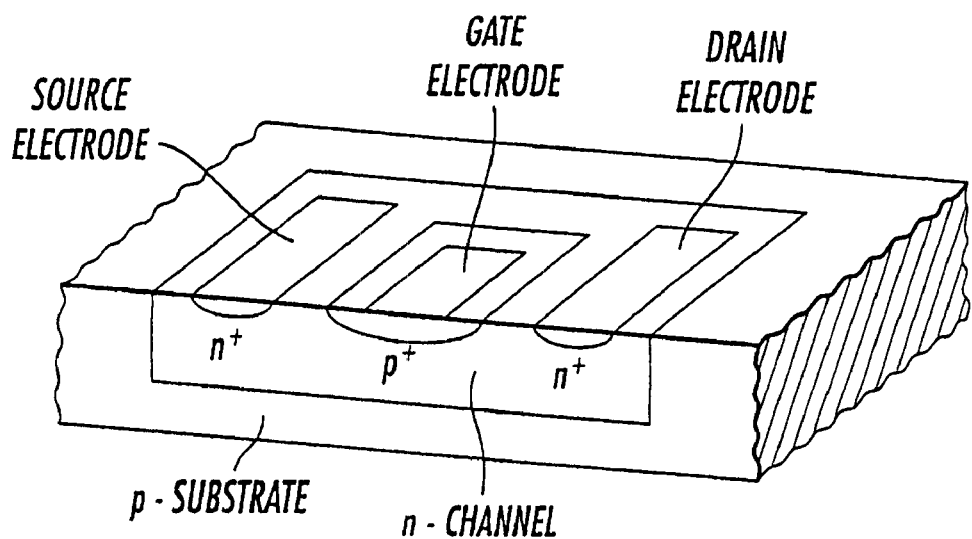

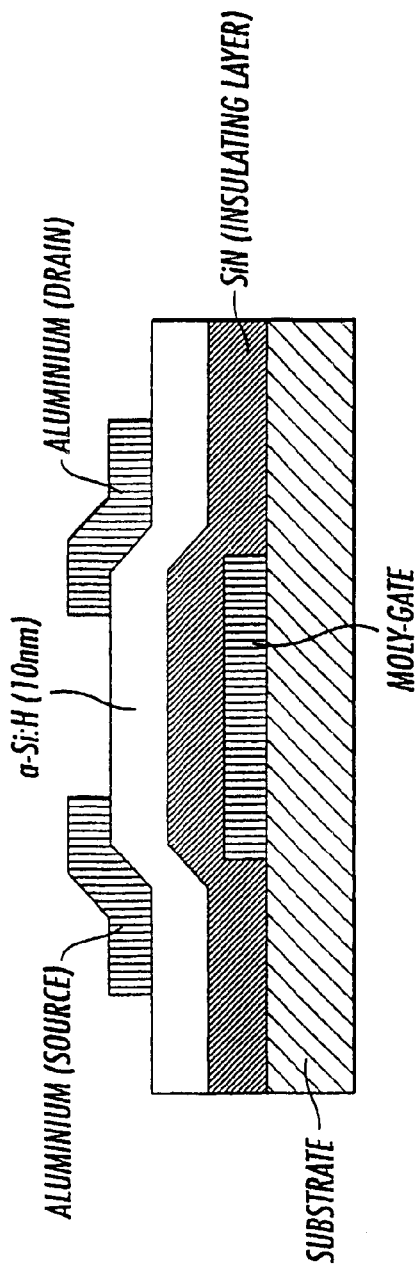
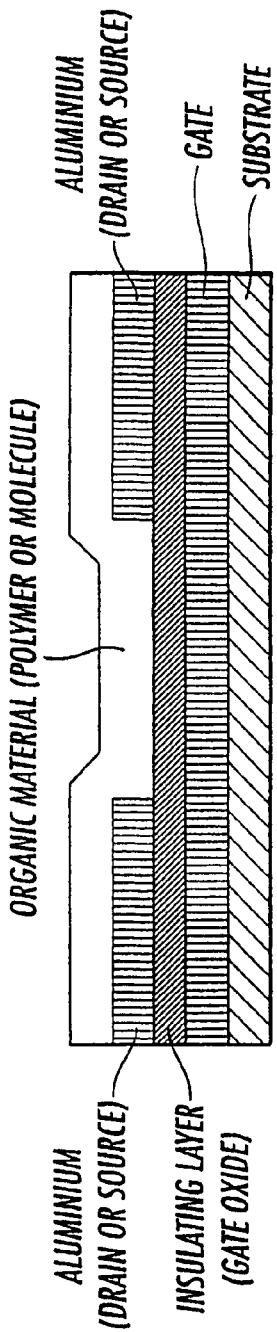
FIG. 1a  STRUCTURE OF AN α-Si:H THIN FILM TRANSISTOR
FIG. 1b  STRUCTURE OF A ORGANIC THIN FILM TRANSISTOR

FIELD-EFFECT TRANSISTOR

The present invention concerns field-effect transistors, respectively a junction field-effect transistor and a metal-oxide semiconductor field-effect transistor (MOSFET) with substantially vertical geometry, wherein the field-effect transistors comprise a planar substrate, of non-conductive material. The invention also concerns a method for fabrication of field-effect transistors of this kind with a substantially vertical geometry, wherein the transistor comprises a planar substrate of non-conducting material.

Field-effect transistors (FET) which use an amorphous material as the active semiconductor are traditionally realized in a horizontal geometry such as rendered in FIG. 1 which shows two examples (FIG. 1a, FIG. 1b) of the realization of a thin-film field-effect transistor according to prior art. Here the drain electrode and the source electrode are mutually separated by a transistor channel. This channel consists of an amorphous semiconductor material. The gate electrode is defined as a horizontal layer which is isolated from the channel by means of the gate isolator. The transistor effect is defined either as a depletion mode or an enrichment mode, depending on the gate potential. As the active amorphous semiconductor material in field-effect transistors of this kind conjugated polymers, aromatic molecules, and amorphous inorganic semiconductors have been used. For instance FIG. 1 shows a thin-film transistor with an active semiconductor material in the form of amorphous Si:H in a 10 nm thick layer (D. B. Thomasson & al., IEEE El. Dev. Lett.,Vol. 18. p. 117; March 1997). A gate electrode which may be of metal, is provided on a substrate. An isolating layer of silicon nitride (SiN) is provided over this gate electrode and the active semiconductor material in form of amorphous Si:H is provided over the isolator in a 10 nm thick layer. The drain electrode and the source electrode are provided mutually spaced apart on the active semiconductor material. They are realized in a different metal than the gate electrode, for instance aluminum. Another example of an organic thin film transistor is shown in FIG. 1b (A. Dodabalapur & al., Appl. Phys. Lett.: Vol. 69, pp.4227–29, December 1996). Here the active semiconductor material is an organic compound, for instance a polymer or aromatic molecules. As in the example in FIG. 1a the gate electrode is provided on a substrate and above the gate electrode an isolator is provided in the form of a layer which may be made by coating the surface of the gate electrode with an oxide layer, something which may be realized by oxidizing the material in the surface of the gate electrode. The source and drain electrode are provided spaced apart on the isolating layer and spaced apart vertical side walls which on one end are mutually connected with a similar vertical transverse wall are provided over the drain and source electrode. In the plane perpendicular to the walls the transistor channel hence obtains a section formed as a U, where the side walls are the legs of the U and the transverse wall the crossline. The layers may be provided standing on a suitable substrate and wholly covered by a layer of isolating material. Over the isolating layer a conducting layer is provided, forming the gate electrode of the transistor. The ends of the side walls or the ends of the legs of the U shaped channel structure are exposed and in these end areas of the channel the source and drain electrodes respectively are formed, for instance by an ion implantation process. The primary object of a thin-film transistor of this kind is to provide a satisfying channel length on a smaller area than can be obtained with more conventional embodiments, while the stray current is reduced when the transistor is in an off-state.

FIG. 1c shows a schematically and in principle a planar JFET structure according to prior art, in this case realized as an n-channel JFET.

The use of an amorphous semiconductor material makes possible the realization of different transistor geometries if the very special processing properties of the amorphous materials are exploited. The object of the present invention is hence to provide a field-effect transistor, respective a junction field-effect transistor (JFET) and a metal-oxide field-effect transistor (MOSFET) with vertical geometry and even more particular the object is to deposit the amorphous active semiconductor material in the form of organic molecules, a conjugated polymer or an amorphous inorganic semiconductor on a vertical structure which comprises both the gate electrode and either the drain electrode or the source electrode. Finally it is also an object to provide a vertically oriented transistor channel.

Common semiconductor devices have formerly been made with vertical geometry. The purpose of this is a more effective exploitation of the chip area. A transistor with vertical geometry is expected to require less space than a transistor with horizontal geometry.

For instance it is from U.S. Pat. No. 5,563,077 (H.C. Ha) known a thin-film transistor with a vertical channel, wherein the channel is formed with two mutually spaced apart vertical side walls which at one end are connected with a similarly vertical end-wall. In the plane perpendicular to the walls the transistor channel hence obtains a U-shaped section, wherein the side walls are the legs of the U and the end wall the cross line. The walls may be provided on a suitable substrate and wholly covered by a layer of isolating material. A conducting layer which forms the gate electrode of the transistor is provided over the isolating layer. The ends of the side walls or the end of the U-shaped channel structure is exposed and on these end areas of the channel the source and drain electrodes respectively are formed, e.g. by means of an ion implantation process. The primary object of a thin film transistor of this kind is to provide a satisfying channel length on a smaller area than that which may be obtained with more conventional embodiments, while the leakage current is reduced when the transistor is in off-state.

The above-mentioned objects and other advantages are achieved according to the invention with a junction field-effect transistor (JFET) which is characterized in that a layer of conducting material which comprises a first electrode is provided on the substrate that a layer of isolating material which forms a first isolator is provided over the first electrode that a layer of conducting material which forms a second electrode is provided over the first isolator, that a further layer of isolating material which forms a second isolator is provided over the second electrode, that a layer of conducting material which forms a third electrode is provided over the second isolator, said first and third electrode respectively comprising the drain and source electrode of the transistor or vice versa and said second electrode the gate electrode of the transistor, that at least said second and said third electrode and said first and second isolator with the respective layers in stacked configuration form a step oriented vertically relative to said first electrode and/or said substrate, and that a semiconductor material which forms the active semiconductor of the transistor is provided over the exposed portion of said first electrode, said second electrode and said third electrode, said active semiconductor contacting the gate electrode directly and forming a substantially vertically oriented transistor channel between said first and said third electrode and a metal-oxide semiconductor field-effect transistor (MOSFET) which is characterized in that a layer of conducting material which comprises a first electrode is provided on the substrate, that a layer of isolating material which forms a first isolator is provided over the first electrode, that a layer of conducting material which forms a second electrode is provided over the first isolator, that a further layer of isolating material which forms a second isolator is provided over the second electrode, that a layer of conducting material which forms a third electrode is provided over the second isolator, said first and third electrode respectively comprising the drain and source electrode of the transistor or vice versa and said second electrode the gate electrode of the transistor, that at least said second and said third electrode and said first and second isolator with the respective layers in stacked configuration form a step oriented vertically relative to said first electrode and/or said substrate, that a vertically oriented layer of isolating material which forms a gate isolator is provided over said second electrode and on said vertical step, and that a semiconductor material which realizes the active semiconductor of the transistor and forms a substantial vertically oriented transistor channel between said first and said third electrode is provided over the exposed portion of said first electrode, said vertical step with said gate isolator and said third electrode.

Further the above-mentioned objects and advantages according to the invention are achieved with a method for fabrication of a field-effect transistor, characterized by the method comprising steps for depositing on said substrate a layer of conducting material which forms a first electrode, forming on the first electrode a step consisting of a photoresist and vertical relative to said first electrode and/or said substrate by means of a photolithograpic process, depositing respectively over both said conducting layer and said photoresist which form the vertical step, a first isolator, a conducting material which forms a second electrode, a second isolator and a conducting material which forms a third electrode in a layerwise stacked configuration, removing said configuration stacked over said photoresist and the photoresist itself by means of a lift-off method, whereby the remaining isolator-electrode configuration provided on the first electrode forms a step oriented vertically relative to said first electrode and/or said substrate, and depositing a soluble amorphous active semiconductor material over said first electrode, and said vertical step, such that semiconductor material contacts both said first and said third electrode which realize respectively a drain or source electrode and vice versa in a field-effect transistor, and said second electrode which realizes the gate electrode of the field effect transistor, thus forming a vertically oriented transistor channel.

Where the field-effect transistor is a metal-oxide field-effect transistor (MOSFET) it is advantageous that an isolating material is being deposited on the vertical step in a vertically oriented layer, which is provided over the second electrode and forms the gate isolator in a field-effect transistor, the deposition taking place after the removal of said stacked configuration and said photoresist, but before the deposition of the soluble amorphous active semiconductor material.

It is according to the invention also advantageous that the active semiconductor material is an amorphous inorganic or organic semiconductor material, but need not be restricted to amorphous semiconductor materials, as it may also be selected among polycrystalline or microcrystalline inorganic or organic semiconductor materials.

Further features and advantages are apparent from the remaining appended dependent claims.

The invention shall now be discussed in greater detail with reference to the drawings wherein FIG. 1a shows an example of prior art as mentioned above, FIG. 1b another example of prior art as mentioned above, FIG. 1c an example of a planar junction field-effect transistor according to prior art, FIG. 2 a preferred embodiment of a junction field-effect transistor according to the invention, FIG. 3 a preferred embodiment of a MOSFET according to the invention, FIGS. 4a–e the different process steps in an embodiment of the method according to the invention whereby the field-effect transistor is realized as a junction field-effect transistor, and FIGS. 5a, 5b further process steps in order to realize a MOSFET according to the invention.

Figure 2:
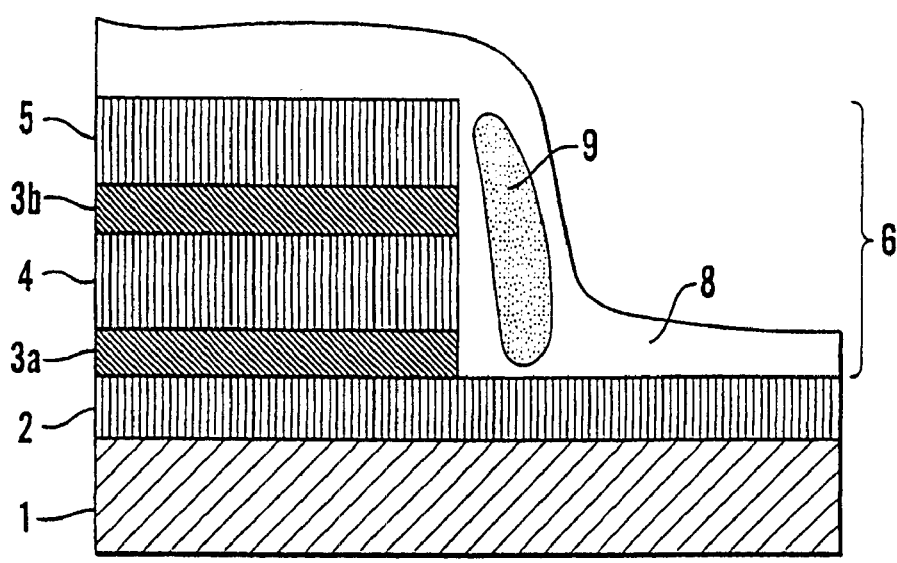

FIG. 2 shows the embodiment of a junction field-effect transistor (JFET) according to the invention. It is wholly realized in thin-film technology, such as will be explained in more detail in the following. On a substrate 1 there is provided a layer 2 of a conducting material which forms a first electrode in the transistor. On this layer an isolating material 3a is provided which forms a first isolator and over the first isolator 3a a further conducting material 4 is provided, for instance a metal which forms a second electrode 4 of the transistor. On the second electrode 4 an isolating material 3b is provided which forms a second isolator in the transistor and over the second isolator 3b a layer 5 of conducting material is provided which forms a third electrode in transistor.

Realized as a junction field-effect transistor the first electrode 2 and the third electrode 5 now respectively form the drain electrode and the source electrode of the transistor or vice versa. The second electrode 4 forms the gate electrode. Both the second and third electrode 4, 5 and the isolators 3a, 3b are provided on the first electrode 2 such that they against the first electrode 2 and the substrate 1 form a vertical step, the extension of which is indicated by the reference number 6 in FIG. 2. Thus the structure consisting of the second and third electrode 4; 5 and the isolators 3 covers only a portion of the substrate 1 and the horizontal extension of the layers which form the vertical step 6 on the first electrode 2 or the substrate 1, may be made comparatively small.

A layer 8 of an active semiconductor material which may be an amorphous, polycrystalline or microcrystalline inorganic or organic semiconductor material, is provided over the top of the third electrode 5 which for instance may be the source electrode of the transistor, over the vertical step 6 and the exposed vertical surface of the gate electrode 4 which is included in the vertical step 6, and down to the first electrode 2. The gate electrode 2 and the semiconductor material 8 now form a pn junction. A substantially vertical transistor channel 9 is defined as either a p channel or a n channel in the active semiconductive material 8 and extends between the first electrode 2 and the third electrode 5 and substantially adjacent to a pn junction at the gate electrode 4. Realized in this manner, the structure shown in FIG. 2 forms a junction field effect transistor (JFET). It may optionally be made with the first electrode 2 as drain electrode and the third electrode 5 as source electrode or vice versa. The transistor effect, in this case the effective size of the transistor channel, is controlled by an electric field which is applied to the transistor channel over the pn junction.

Figure 3:
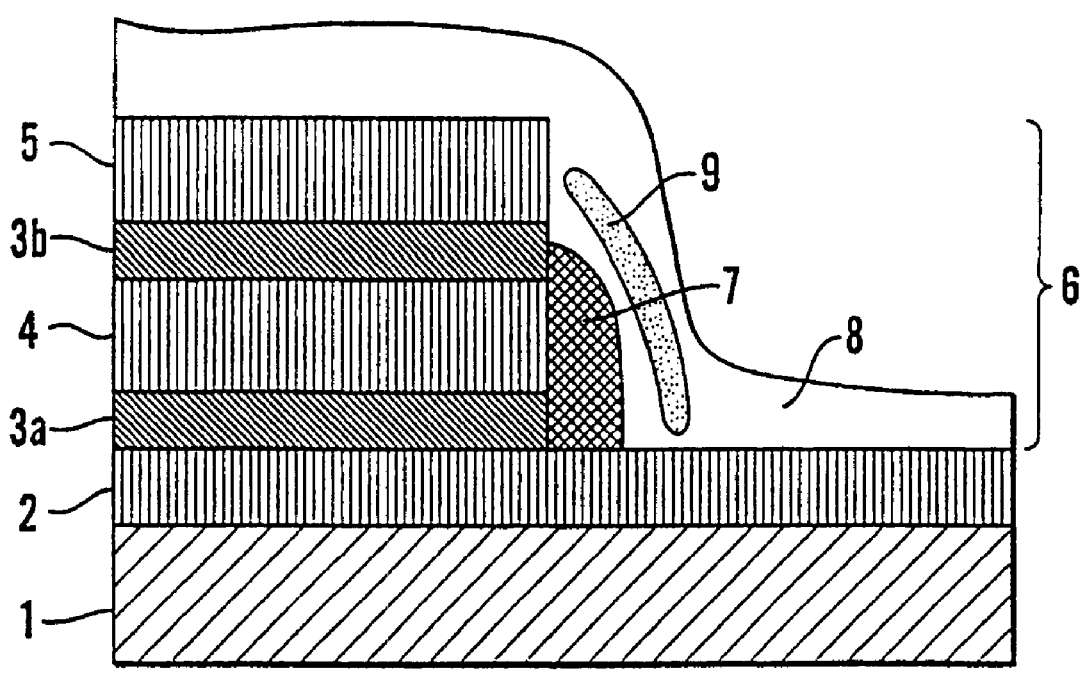

FIG. 3 shows the embodiment of a MOSFET according to the invention. It is wholly realized in thin-film technology, as will be explained in more detail in the following. On a substrate 1 a layer 2 of conducting material is provided which forms a first electrode in the transistor. On this layer an isolating material 3a which forms a first isolator is provided and over the first isolator 3a a further conducting material is provided, for instance metal, which forms a second electrode in the transistor. On the second electrode 4 an isolating material 3b is provided which forms a second isolator in the transistor, and over the second isolator 3b a layer 5 of conducting material is provided which forms a third electrode of the transistor.

Realized as a MOSFET the first electrode 2 and the third electrode 5 now forms respectively the drain electrode and the source electrode of the transistor or vice versa. The second electrode 4 forms the gate electrode. Both the second and the third electrode 4;5 and isolators 3a. 3b are provided on the first electrode 2 such that they in relation to the first electrode 2 and the substrate 1 form a vertical step, the extension of which is indicated by the reference number 6 in FIG. 2. Thus the structure consisting of the second and the third electrode 4,5 and the isolators 3 covers only a portion of the substrate 1 and the horizontal extension of the layers which form the vertical step 6 on the first electrode 2 or the substrate 1, may be made comparatively small.

Over the exposed vertical surface of the gate electrode 4 which is included in the vertical step 6, an isolating material 7 is provided which forms the gate isolator of the field-effect transistor. Over the top of the third electrode 5 which for instance may be the source electrode of the transistor, over the vertical step 6 and down to the first electrode 2 a layer of active semiconductor material is provided which may be an amorphous, polycrystalline or microcrystalline inorganic or organic semiconductor material. The gate electrode 4 is isolated against the active semiconductor material 8 by the gate isolator 7 such that charge injection is prevented. A substantially vertical transistor channel is defined in the active semiconductor material 8 and extends between the first electrode 2 and the third electrode 5 and substantially adjacent to the vertical step 6. Realized in this manner the structure shown in FIG. 2 forms a metal-oxide semiconductor field-effect transistor (MOSFET). Optionally it may made with a first electrode 2 as drain electrode and the third electrode 5 as source electrode or vice versa. The transistor effect will either be given by a depletion mode or an enrichment mode, depending on the gate potential.

It is to be understood that the substrate 1 in the embodiments in FIGS. 2 and 3 exclusively is intended to be a carrier of the transistor structure. Further the conducting layer 2 and the first electrode are provided over the whole substrate. i.e. unpatterned, but it may equally well be patterned and might then for instance cover a portion of the substrate corresponding to that covered by the vertical step structure. For instance may then the first electrode in the embodiment in FIG. 2 flush with the surface of the vertical step 6 and itself present a vertical step in relation to the substrate 1. This vertical step may here for instance flush with the vertical surface of the gate isolator 7. It is, of course, a condition that the necessary contact to the active semiconductor material 8 is obtained. A first electrode with a vertical step in relation to the substrate may additionally be advantageous if the first electrode shall be connected Galvanically with corresponding electrodes on other transistors in a transistor network. For this purpose an electric conductor may then be provided on the horizontal surface of the substrate beyond the vertical step.

Now a method for fabrication of a junction field-effect transistor in thin-film technology according to the invention shall be discussed in more detail with reference to FIGS. 4a–e. A central task in connection with the fabrication of junction field-effect transistors as shown in FIGS. 2 and 3 is the forming of the vertical step over which the transistor effect in its entirety will be present. For instance a so-called lift-off method may be used which has proved to be an effective method for forming a vertical surface.

It is to be understood that the different process steps which is shown in FIGS. 4a–e and which now shall be discussed, are rendered schematically and simplified.

Figure 4A:
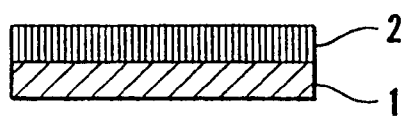
Figure 4B:
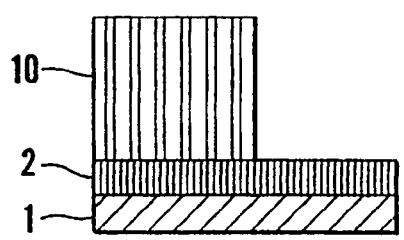
Figure 4C:
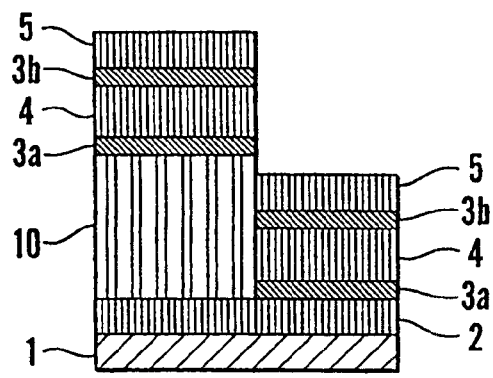

As shown in FIG. 4a a layer 2 of conductive material is deposited in a first process step on the substrate 1 which itself is made in an isolating or dielectric material. The conducting material 2 now will be forming the first electrode of the transistor. Above the conducting material 2 a photoresist is deposited and masked and etched according to well-known photolithographic procedures, such that a patterned photoresist layer 10 with a vertical step 11 is formed on the first electrode 2. This is shown in FIG. 4b and comprises a second process step of the method. In a third process step shown in FIG. 4c, the isolating layer 3a which forms the first isolator, a conducting material 4, which forms the second electrode of the transistor, a second isolating layer 3b which forms the second isolator, and on the top thereof a layer 5 of conducting material which forms a third electrode of the transistor are provided sequentially. By using for instance a vapor deposition process the layers 3,4,5 now will cover both the exposed portion of the first electrode 2 and the top of the photoresist 10 in horizontally stacked layers, such as evident from FIG. 4c.

In a fourth process step a lift-off method is now used for removing the layer on the top of the photoresist and the photoresist 10 itself. This is done by means of a solvent process, for instance with acetone. When the photoresist 10 and the layers on the top thereof are removed, the component appears as shown in FIG. 4d after the fourth process step and with a step 6 vertically oriented relative to the first electrode 2 or the substrate 1.

Figure 4D:
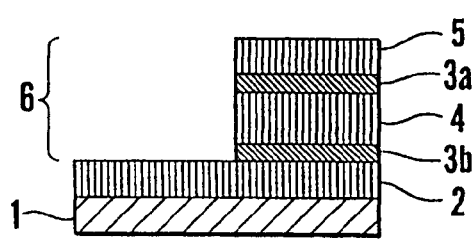
Figure 4E:
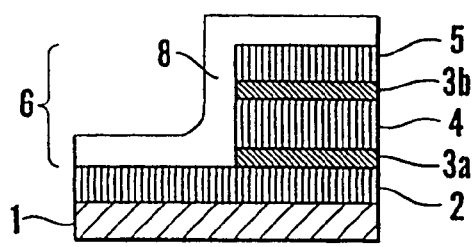

Then a soluble amorphous active semiconductor material 8 is deposited over the first electrode 2, the second electrode 4 and the vertical step 6 and the top surface of the third electrode 5 in a fifth process step shown in FIG. 4e. The active semiconductor 8 thus will cover the layer structures both horizontally and vertically. In case the first electrode 2 is patterned and only covers a portion of the substrate 1, for instance such that it itself forms a vertical step which is flush with the vertical step 6, there will in addition neither be a problem with the contact between the first electrode 2 and the active semiconductor material 8.

Figure 5A:
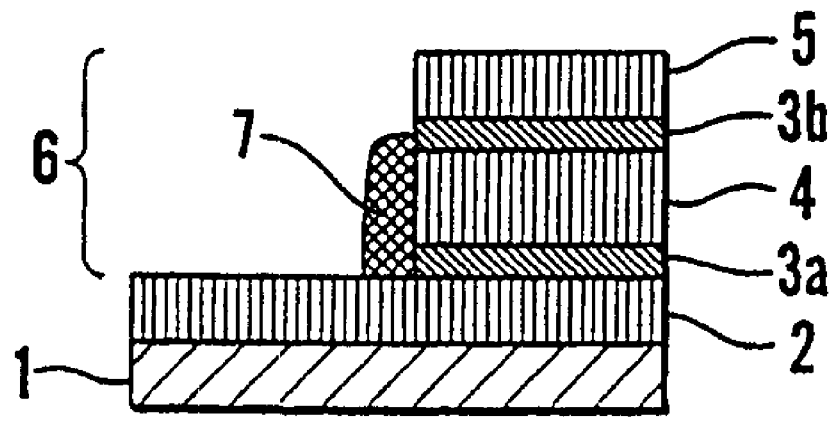

In the fabrication of a MOSFET in thin-film technology according to the invention an intermediate process step shown in FIG. 5a is applied after the fourth process step shown in FIG. 4d. In this further process step an isolating layer 6 is provided over the second electrode 4 such that the surface thereof is covered in the vertical step 6. This isolating layer 7 now comprises the gate isolator of the MOSFET and prevents charge injection. The gate isolator 7 may be made in a process where an oxide is provided with the first electrode 2 as substrate. Then a vertical etching step is used for forming the gate isolator 7 oriented in the vertical direction such that it covers the gate electrode 4. Alternatively the gate isolator 7 also could be provided by making the gate electrode 4 in a material which may be oxidized selectively or processed in one way or another such that an isolating layer is formed on the surface of the gate electrode. Preferably this may take place by selective oxidation of the material in the surface of the gate electrode 4.

Figure 5B:
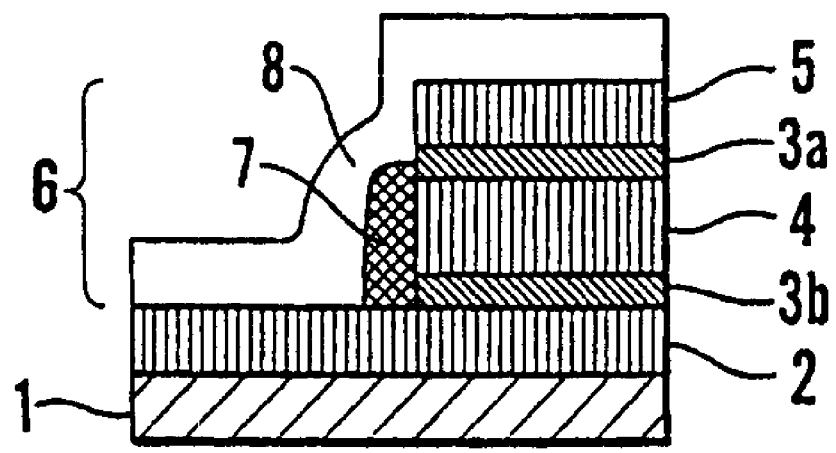

After having provided the gate isolator 7 in the further process step shown in FIG. 5a, the soluble amorphous active semiconductor material 8 is applied over the first electrode 2, the gate isolator 7, the vertical step 6, and the top surface of the third electrode 5 in the process step shown in FIG. 5*b*. This process step corresponds to the fifth process step shown in FIG. 4*e* The active semiconductor material thus will cover the layer structures both horizontally and vertically. In case the first electrode 2 is patterned and covers only a portion of the substrate 1, but such that it extends somewhat beyond the vertically stacked layers, there will in addition be no problem with the contacting between the first electrode 2 and the active semiconductor material 8.

For the application of the amorphous active semiconductor material 8 methods like vacuum sublimation, vacuum deposition, spin coating and casting from solutions may be used. This implies that the amorphous active semiconductor material 8 in principle may be made with various structures which for instance cover the gate electrode 4 with different orientation both vertically and horizontally. It is also to be understood that the various active materials may be mixed or combined in the amorphous semiconductor material in order to provide the field-effect transistor with special functions. If the field-effect transistor is a JFET, it may particularly be desired to use materials which spontaneously form a Schottky junction with the gate electrode, such that a MESFET structure is obtained.

Even if the fabrication of the field-effect transistors according to the invention in FIGS. 2 and 3 is shown for an in principle discrete component, there is nothing against fabricating transistors of this kind and with the method used in semi- or full- continuous reel-to-reel processes with global layer application. The active semiconductor material 8 may this the way be applied in a continuous process. Correspondingly, also the gate isolator may in this way be applied in a continuous process if the field-effect transistor is a MOSFET. In a continuous process the vertical step 6 then advantageously will be formed parallel with the movement direction of the line and both the gate isolator 7 and the active semiconductor material may be applied as continuous strips on the vertical step. After the last process step shown in FIG. 4*e* or FIG. 5*b*, the individual transistors may be separated from the line and completed in the form of discrete components.

However, there is nothing against that greater portions of the line with a large number of transistors may form a transistor array which in its turn may be used for realizing active memory modules with the individual transistor as a memory element. The transistor must then be connected in a galvanic network by forming suitable conducting structures for the connections.

Generally vertical field-effect transistor as disclosed herein may be realized as structural parts in integrated electronic circuits in two and three dimensions. Possible applications of such circuits may be memories, processors etc. An obvious advantage of using active memory components based on transistors according to the present invention is the possibility of writing in small-signal mode and reading in large-signal mode, which particularly will be an advantage in electrical addressing of memory locations in large memory modules realized in a matrix network.

In regard of the fabrication process for the field-effect transistors according to the invention, it may as mentioned be realized globally by using continuous lines. In such a case it will also be possible to fabricate field-effect transistors as JFET and MOSFET with a vertical geometric structure by means of a printing method and not only by using well-known fabrication processes for VLSI components.

What is claimed is:

1. A field-effect transistor forming a junction field-effect transistor (JFET) with substantially vertical geometry, wherein the transistor comprises a planar substrate of non-conducting material, a layer of conducting material which comprises a first electrode provided on the substrate, a layer of isolating material which forms a first isolator provided over the first electrode, a layer of conducting material which forms a second electrode provided over the first isolator, a further layer of isolating material which forms a second isolator provided over the second electrode, a layer of conducting material which forms a third electrode provided over the second isolator, said first and third electrode respectively comprising the drain and source electrode of the transistor or vice versa and said second electrode the gate electrode of the transistor, at least said second and said third electrode and said first and second isolator with the respective layers in stacked configuration forming a step oriented vertically relative to said first electrode and/or said substrate, and a semiconductor material which realizes the active semiconductor of the transistor provided over the exposed portion of said first electrode, said second electrode and said third electrode, said active semiconductor contacting the gate electrode directly and forming a channel between said first and said third electrode.

2. A field-effect transistor forming a metal-oxide semiconductor field-effect transistor (MOSFET) with substantially vertical geometry, wherein the transistor comprises a planar substrate of non-conducting material, a layer of conducting material which comprises a first electrode provided on the substrate, a layer of isolating material which forms a first isolator provided over the first electrode, a layer of conducting material which forms a second electrode provided over the first isolator, a further layer of isolating material which forms a second isolator provided over the second electrode, a layer of conducting material which forms a third electrode provided over the second isolator, said first and third electrode respectively comprising the drain and source electrode of the transistor or vice versa and said second electrode the gate electrode of the transistor, at least said second and said third electrode and said first and second isolator with the respective layers in stacked configuration forming a step oriented vertically relative to said first electrode and/or said substrate, a vertically oriented layer of isolating material which forms a gate isolator provided over said second electrode and on said vertical step, and a semiconductor material which realizes the active semiconductor of the transistor and forms a transistor channel between said first and said third electrode provided over the exposed portion of said first electrode, said vertical step with said gate isolator and said third electrode.

3. A field-effect transistor according to claim 1, wherein the first electrode is provided patterned on the substrate and forms a further intermediate step relative to the substrate, whereby every electrode presents a substantially vertical surface to the active semiconductor.

4. A field-effect transistor according to claim 1, wherein the semiconducting material is selected among amorphous, polycrystalline or microcrystalline inorganic or organic semiconductor materials.

5. A field-effect transistor according to claim 1, wherein the transistor channel is defined as the vertical portion of the active semiconductor between said first and said third electrode and adjacent to the vertical step formed by the stacked configuration.

6. A field-effect transistor according to claim 1, wherein the semiconducting material and the gate electrode spontaneously form a Schottky junction.

7. A field-effect transistor according to claim 1, wherein the transistor channel is defined as an n channel or p channel in the vertical portion of the active semiconductor between said first and second electrode and adjacent to a pn junction at the gate electrode.

8. A field-effect transistor according to claim 2, wherein the gate isolator is formed as an oxide coating on the vertical surface of the gate electrode.

9. A field-effect transistor according to claim 8, wherein the oxide coating is formed by an oxide layer of the electrode material in the surface of the gate electrode.

10. A method for fabrication of a field-effect transistor with substantially vertical geometry, wherein the transistor comprises a planar substrate of non-conducting material, the method comprising steps for depositing on said substrate a layer of conducting material which forms a first electrode, forming on the first electrode a step consisting of a photoresist and vertical relative to said first electrode and/or said substrate by a photolithograpic process, depositing respectively over both said conducting layer and said photoresist which form the vertical step, a first isolator, a conducting material which forms a second electrode, a second isolator and a conducting material which forms a third electrode in a layerwise stacked configuration, removing said configuration stacked over said photoresist and the photoresist itself by a lift-off method, whereby the remaining isolator-electrode configuration provided on the first electrode forms a step oriented vertically relative to said first electrode and/or said substrate, and depositing a soluble amorphous active semiconductor material over said first electrode, and said vertical step, such that semiconductor material contacts both said first and said third electrode which realize respectively a drain or source electrode and vice versa in a field-effect transistor, and said second electrode which realizes the gate electrode of the field effect transistor, thus forming a vertically oriented transistor channel.

11. A method according to claim 10, wherein the field-effect transistor is a metal-oxide semiconductor field-effect transistor (MOSFET), and an isolating material being deposited on the vertical step in a vertically oriented layer, which is provided over the second electrode and forms the gate isolator in a field-effect transistor, the deposition taking place after the removal of said stacked configuration and said photoresist, but before the deposition of the soluble amorphous active semiconductor material.

12. A method according to claim 11, wherein the gate isolator being formed as an oxide coating on the vertical surface of the gate electrode.

13. A method according to claim 12, wherein the oxide coating being formed by selective oxidation of the electrode material in the surface of the gate electrode.

14. A method according to claim 10, wherein the first electrode being deposited patterned on the substrate and covering only partially the latter.

* * * * *